United States Patent
Li et al.

(10) Patent No.: US 12,219,303 B2
(45) Date of Patent: Feb. 4, 2025

(54) SWITCH SUBRACK AND CABINET SYSTEM

(71) Applicant: HUAWEI TECHNOLOGIES CO., LTD., Guangdong (CN)

(72) Inventors: Daohong Li, Shenzhen (CN); Xian Zhang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 196 days.

(21) Appl. No.: 17/948,369

(22) Filed: Sep. 20, 2022

(65) Prior Publication Data

US 2023/0016012 A1    Jan. 19, 2023

Related U.S. Application Data

(63) Continuation of application No. PCT/CN2021/083614, filed on Mar. 29, 2021.

(30) Foreign Application Priority Data

Mar. 31, 2020    (CN) .......................... 202010247347.1

(51) Int. Cl.
*H04Q 1/02*    (2006.01)
*H04Q 1/04*    (2006.01)

(52) U.S. Cl.
CPC ............ *H04Q 1/155* (2013.01); *H04Q 1/025* (2013.01); *H04Q 1/04* (2013.01)

(58) Field of Classification Search
CPC .......... H04Q 1/155; H04Q 1/025; H04Q 1/04; H04Q 1/09; H04L 49/00; H05K 7/02; H05K 7/14; H05K 7/18; H05K 5/0217; H05K 5/0247; H05K 7/1417; H05K 7/183

See application file for complete search history.

(56) References Cited

U.S. PATENT DOCUMENTS

| | | |
|---|---|---|
| 6,582,241 B1 | 6/2003 | Lutz, Jr. |
| 10,568,238 B1 | 2/2020 | Leung et al. |
| 2005/0176307 A1* | 8/2005 | Lang .................... H01R 12/724 439/676 |

(Continued)

FOREIGN PATENT DOCUMENTS

| | | |
|---|---|---|
| CN | 101032195 A | 9/2007 |
| CN | 201107871 Y | 8/2008 |

(Continued)

OTHER PUBLICATIONS

Liu Minghui, "Grounding system of 5ESS-2000 program-controlled exchange", Heilongjiang Science and Technology Information, Editorial Office Mailbox, Issue 31, 2013, with an English abstract, total 3 pages.

*Primary Examiner* — Phung-Hoang J Nguyen

(57) ABSTRACT

A network switch subrack in a cabinet system is configured to bear a network switch. The network switch subrack includes an outer frame that is configured to be plugged into the cabinet. The outer frame includes a cavity sized to accommodate the network switch. The network switch subrack further includes a fastening assembly that is disposed in the outer frame and configured to fasten the network switch in the cavity in the outer frame. The network switch subrack further includes a transfer module having a first end pluggably connected to the cabinet system and a second end pluggably connected to the network switch.

20 Claims, 10 Drawing Sheets

(56) References Cited

U.S. PATENT DOCUMENTS

| | | | |
|---|---|---|---|
| 2008/0112133 A1 | 5/2008 | Torudbakken et al. | |
| 2014/0002988 A1* | 1/2014 | Roesner | H05K 7/20727 361/679.49 |
| 2017/0310363 A1 | 10/2017 | Liu et al. | |
| 2019/0052066 A1* | 2/2019 | Robertson | H05K 7/1487 |

FOREIGN PATENT DOCUMENTS

| | | | |
|---|---|---|---|
| CN | 101351111 A | 1/2009 |
| CN | 101873781 A | 10/2010 |
| CN | 102141825 A | 8/2011 |
| CN | 102541174 A | 7/2012 |
| CN | 102541195 A | 7/2012 |
| CN | 102749971 A | 10/2012 |
| CN | 103174916 A | 6/2013 |
| CN | 203151537 U | 8/2013 |
| CN | 203340496 U | 12/2013 |
| CN | 103562817 A | 2/2014 |
| CN | 104363738 A | 2/2015 |
| CN | 205196147 U | 4/2016 |
| CN | 106982524 A | 7/2017 |
| CN | 108075419 A | 5/2018 |
| CN | 108206791 A | 6/2018 |
| CN | 108781519 A | 11/2018 |
| CN | 109257307 A | 1/2019 |
| CN | 208370062 U | 1/2019 |
| CN | 109428395 A | 3/2019 |
| CN | 110069106 A | 7/2019 |
| CN | 209805857 U | 12/2019 |
| CN | 210093417 U | 2/2020 |
| CN | 210183766 U | 3/2020 |
| CN | 210839636 U | 6/2020 |
| EP | 3079450 A1 | 10/2016 |
| JP | 3085705 U | 5/2002 |
| WO | 2014130403 A1 | 8/2014 |
| WO | 2019209328 A1 | 10/2019 |

* cited by examiner

SWITCH SUBRACK AND CABINET SYSTEM

CROSS-REFERENCE TO RELATED APPLICATIONS

This application is a continuation of International Application No. PCT/CN2021/083614, filed on Mar. 29, 2021, which claims priority to Chinese Patent Application No. 202010247347.1, filed on Mar. 31, 2020. The disclosures of the aforementioned applications are hereby incorporated by reference in their entirety.

TECHNICAL FIELD

This application relates to the field of communications technologies, and in particular, to a network switch subrack and a cabinet system.

BACKGROUND

In an existing general-purpose rack system, nodes and switches are interconnected through optical fibers and power cables. In this architecture, cabling between compute nodes and the switches is complex, and maintenance and deployment are time-consuming and labor-consuming. As a deployment scale of the nodes and the switches is increased, a quantity of used switches is increased, and a quantity of cables between switches and nodes in a cabinet is increased. As a result, cable deployment becomes more difficult. In addition, automatic maintenance is difficult in this architecture.

SUMMARY

This application provides a switch subrack and a cabinet system, to implement blind mating of a switch and facilitate installation of the switch.

According to a first aspect, a switch subrack is provided. The switch subrack is configured to mount a switch, and assemble the switch into a cabinet in a cabinet system. The switch subrack includes an outer frame. The outer frame can be plugged into the cabinet. The outer frame includes a cavity for accommodating the switch. A size of the cavity adapts to the switch. The switch subrack further includes a fastening assembly. The fastening assembly is disposed in the outer frame and is configured to fasten the switch, to fasten the switch in the cavity in the outer frame. The switch subrack further includes a transfer module. The transfer module is disposed on the outer frame, one end of the transfer module is pluggably connected to the cabinet system, and the other end of the transfer module is pluggably connected to the switch. The switch is adapted to the cabinet by using the transfer module. It can be learned from the foregoing description that, in the switch subrack provided in this application, a connection port of the switch may be converted into a blind-mate interface by using the disposed transfer module, to implement blind mating of the switch, facilitate connection between the switch and the cabinet system, and reduce cables disposed during connection.

In a possible implementation, the transfer module includes a signal transfer module and a power transfer module that are fixedly connected to the outer frame. The disposed signal transfer module and power transfer module are configured to implement signal communication and an electrical connection between the switch and the cabinet.

In a possible implementation, the signal transfer module includes a blind-mate connector, a connection end of the blind-mate connector is exposed outside a side wall of the outer frame, and the connection end of the blind-mate connector is configured to be pluggably connected to the cabinet system. Blind mating between the switch and the cabinet system is implemented by using the blind-mate connector, to facilitate connection between the switch and the cabinet system.

In another possible implementation, the signal transfer module further includes a circuit board that is connected to the blind-mate connector, and a cable connector disposed on the circuit board. The signal transfer module further includes a first connection cable. The first connection cable has a first connection end that is pluggably connected to the cable connector and a second connection end that is pluggably connected to the switch. The signal transfer module is detachably connected to the switch through the first connection cable, to facilitate replacement of different switches.

In another possible implementation, a first jack cooperating with the blind-mate connector is disposed on a second panel of the outer frame, and a connection port of the blind-mate connector passes through the first jack and is exposed outside the outer frame, to facilitate connection to the cabinet. The second panel of the outer frame refers to a side wall located on an innermost side of the cabinet when the outer frame is plugged into the cabinet.

In another possible implementation, the power transfer module includes a copper power-obtaining clip, a power adapter module connected to the copper power-obtaining clip, and a second connection cable. The second connection cable has a third connection end that is pluggably connected to the power adapter module and a fourth connection end that is pluggably connected to the switch.

The power transfer module is detachably connected to the switch through the second connection cable, to facilitate replacement of switches.

In another possible implementation, the copper power-obtaining clip is disposed on a side wall of the outer frame in a floating manner, to facilitate fine adjustment.

In another possible implementation, a second jack is disposed on the second panel of the outer frame, and the copper power-obtaining clip passes through the second jack and is exposed outside the outer frame.

In another possible implementation, an I/O module that is detachably fastened to the outer frame is further included, and the I/O module is fixedly connected to the switch in a removable manner, to enable the switch to connect to an external signal.

In another possible implementation, a third jack is disposed on a first panel of the outer frame, and the I/O module passes through the third jack and is exposed outside the plastic frame, to facilitate connection to an external signal.

In another possible implementation, the fastening assembly is a fastening assembly that can be adjusted based on a size of the switch, to fasten switches of different sizes, so as to improve applicability of the switch subrack.

In another possible implementation, the fastening assembly includes two connection assemblies configured to fasten the switch, and each connection assembly includes a first support component and a second support component.

The switch includes two mounting bracket groups that are disposed opposite to each other, the two mounting bracket groups are in a one-to-one correspondence with the two connection assemblies, and each mounting bracket group includes a first mounting bracket that can extend or retract in a first direction and a second mounting bracket that has a fixed length.

The first mounting bracket is detachably fastened to the first support component, and the second mounting bracket is detachably fastened to the second support component. Four mounting brackets are cooperated with four support components to fasten the switch.

In another possible implementation, at least one connection assembly of the two connection assemblies is slidably connected to the outer frame and can be locked at a specified location, the at least one connection assembly slides in a second direction, and the second direction is perpendicular to the first direction. In this way, switches of different sizes can be adapted.

In another possible implementation, two guide rails disposed in parallel are disposed in the outer frame, and a first support component and a second support component in the at least one connection assembly are slidably assembled on the two guide rails disposed in parallel in a one-to-one correspondence and can be locked at specified locations. Cooperation between the support component and the outer frame is implemented by using the guide rail.

In another possible implementation, the two connection assemblies are separately slidably connected to the outer frame. This improves applicability.

In another possible implementation, the two connection assemblies may be rotated relative to the outer frame, so that the switch may be tilted at a specific angle relative to the outer frame, to facilitate maintenance of the switch.

In another possible implementation, in the two connection assemblies, the first support component includes a bottom plate and a support plate that is rotatably connected to the bottom plate, and the support plate is configured to be detachably fastened to a corresponding first mounting bracket. An axis around which the bottom plate and the support plate rotate is parallel to the second direction. This facilitates removal of the switch from the outer frame.

In another possible implementation, a hollowed-out structure cooperating with the switch is disposed on a bottom plate of the outer frame, to reduce impact of the switch on the entire outer frame.

In another possible implementation, a pluggable force-borrowing wrench that is rotatably connected to the outer frame is further included. The outer frame can be conveniently plugged out from the cabinet by using the pluggable force-borrowing wrench.

According to a second aspect, a cabinet system is provided. The cabinet system includes a cabinet, the switch subrack according to any one of the foregoing implementations that is pluggably disposed in the cabinet, and a switch that is fastened in the switch subrack. In the switch subrack provided in this application, a connection port of the switch may be converted into a blind-mate interface by using the disposed transfer module, to implement blind mating of the switch without changing a structure of the switch.

REFERENCE NUMERALS

1—Cabinet 2—Compute node 3—Switch subrack 4—Blind-mate backplane
5—Copper bar 6—Blind-mate connector 10—Outer frame 11—First side wall
111—Jack 112—Grid region 12—Third side wall 13—Second side wall
131—Guide sleeve 132—Second jack 14—Third side wall 15—Bottom plate
151—Hollowed-out structure 16—Guide rail 20—Transfer module 21—Signal transfer module
211—Blind-mate connector 212—Circuit board 213—Cable connector 214—First connection cable
2141—First connection end 22—Power transfer module 221—Copper power-obtaining clip
222—Power adapter
223—Second connection cable 224—Fastening screw 30—I/O module 40—Fastening assembly
41—First support component 411—Support plate 412—Bottom plate 42—Second support component
50—Switch 51—Network interface 52—First mounting bracket 521—Second support plate
522—First support plate 53—Second mounting bracket 60—Force-borrowing wrench 61—
First end
62—Second end

DESCRIPTION OF EMBODIMENTS

Figure 1:
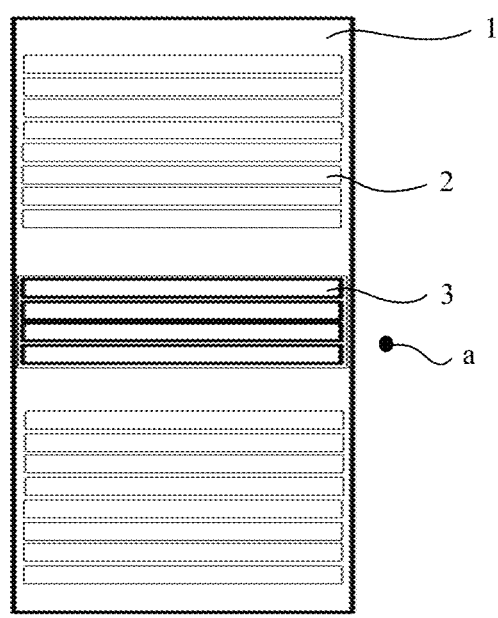
FIG. 1 is a schematic diagram of a cabinet system according to this application.

To facilitate understanding of a switch subrack provided in embodiments of this application, the following first describes an application scenario of a switch. The switch is applied to a cabinet system. FIG. 1 is a schematic diagram of a cabinet system. The cabinet system mainly includes a cabinet 1 (including a power supply), a compute node 2, a switch subrack 3, and a switch and a backplane (not shown in the figure) disposed in the switch subrack 3. The backplane is disposed in the cabinet 1 and is configured to connect to the switch. A slot cooperating with the switch subrack 3 is disposed in the cabinet 1. Refer to a black dot in FIG. 1. The black dot represents a direction a, and the direction a points from outside the paper to inside the paper. During assembly, the switch subrack 3 is plugged into the slot along the direction a and may be fastened in the slot. A plurality of compute nodes 2 are fastened in the cabinet 1. The compute nodes 2 are connected to the switch through the backplane. For example, the switch is a 1U switch and is located in the middle of the cabinet 1. A quantity of switches is determined based on a network switching scale of the cabinet 1, and may be two or four. U is a unit indicating outer dimensions of a server. 1U is 4.445 cm.

Figure 2:
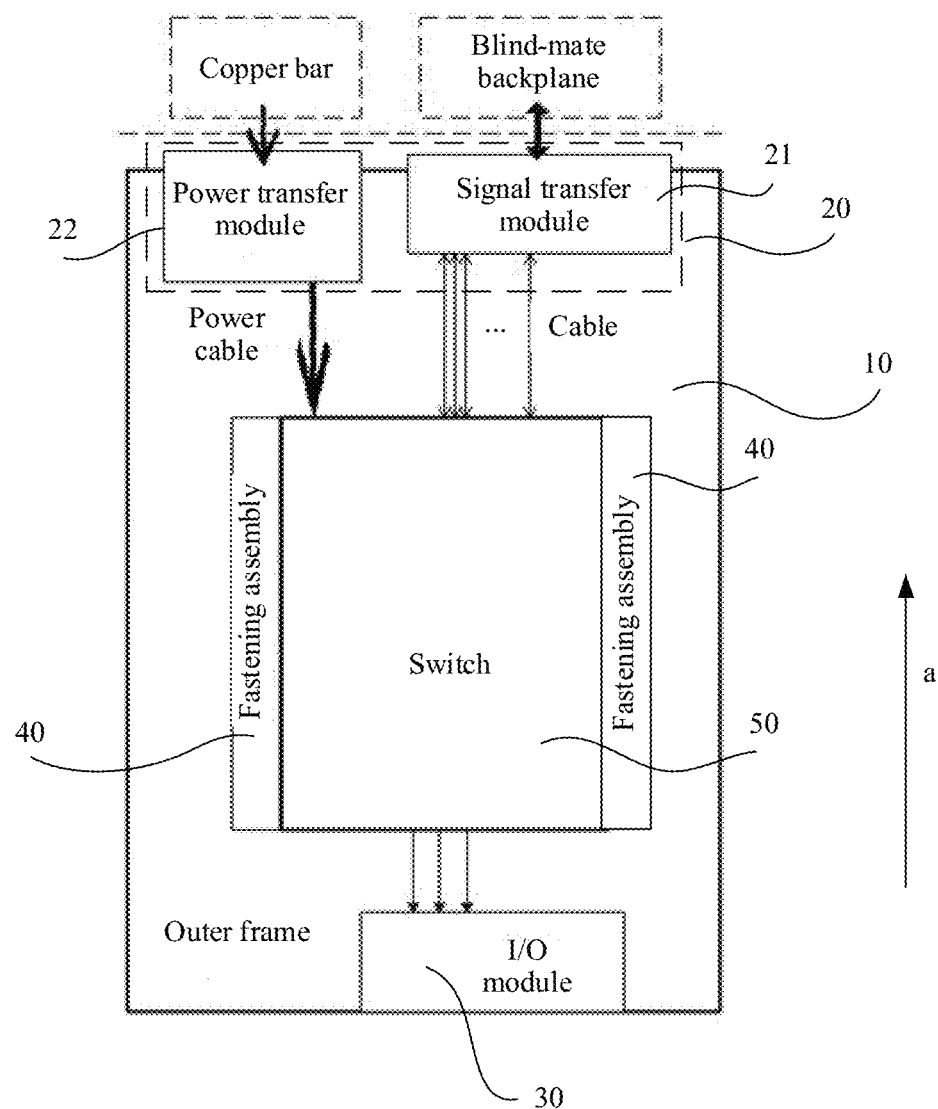
FIG. 2 is a diagram of a topology of a switch subrack according to this application.

FIG. 2 is a diagram of a topology of a switch subrack according to an embodiment of this application. The switch subrack includes an outer frame 10, a fastening assembly 40, and a transfer module 20. The outer frame 10 is plugged into a slot of a cabinet. A direction shown by using an arrow a in FIG. 2 is a plugging-in direction along which the outer frame 10 is plugged into a switch 50. To facilitate description, a second panel and a first panel of the outer frame 10 are defined. The first panel and the second panel of the outer frame 10 are two opposite side walls of the outer frame 10. The second panel of the outer frame 10 refers to a side wall located on an innermost side of the cabinet when the outer frame 10 is plugged into the cabinet along the direction a. The first panel of the outer frame 10 refers to a side wall exposed outside the cabinet when the outer frame 10 is plugged into the cabinet along the direction a. The outer frame 10 includes a cavity for accommodating the switch 50, and a fastening assembly 40 configured to fasten the switch 50 is disposed in the cavity. In an optional solution, the fastening assembly 40 includes two parts, and the two parts are respectively arranged on two sides of the switch 50, so that the switch 50 can be fastened in the outer frame 10 from two opposite sides, to ensure stability of the switch 50. Certainly, the fastening assembly 40 in this embodiment of this application may alternatively be disposed only on one side of the switch 50, provided that stability of the switch 50 can be ensured. The transfer module 20 is fastened in the outer frame 10. One end of the transfer module 20 is a first end, and the other end of the transfer module 20 is a second end. The first end of the transfer module 20 may be pluggably connected to a cabinet system, and the second end of the transfer module 20 may be pluggably connected to the switch 50.

In an optional solution, the transfer module 20 includes a signal transfer module 21 and a power transfer module 22 that are fixedly connected to the outer frame 10. The signal transfer module 21 is a hardware component, and is configured to convert an interface on the switch into an interface that matches and is connected to a connector on a backplane in the cabinet, to implement a signal connection between the switch 50 and the cabinet system. The power transfer module 22 is a hardware component, and is configured to convert a power interface on the switch into an interface that matches and is connected to a copper bar in the cabinet, to implement an electrical connection between the switch 50 and the cabinet system. In an optional solution, the transfer module 20 may alternatively be one module. The module is an integrated module, and may implement both electrical and signal transmission.

In an optional solution, the switch subrack further includes an input/output (input/output, I/O) module 30, and the I/O module 30 is disposed in the outer frame 10, and is specifically disposed on a side of the first panel of the outer frame 10. One end of the I/O module 30 is pluggably connected to the switch 50, and the other end of the I/O module 30 is used for a signal connection to a device outside the cabinet system. The I/O module 30 may be configured to implement a signal connection between the switch 50 and a device outside the cabinet system. In a specific example, the I/O module 30 may include an I/O used to connect to an upper-layer aggregation switch, an I/O reserved for management and maintenance, and a status indication module. The I/O module 30 may be connected to the first panel through an optical fiber or a network cable as required. The status indication module may be an indicator. The indicator of the switch 50 may be connected to the first panel through a light pipe or a light cable, to indicate a status of the indicator of the switch 50.

The following describes a specific structure of an outer frame provided in this application with reference to FIG. 3 to FIG. 7.

Figure 3:
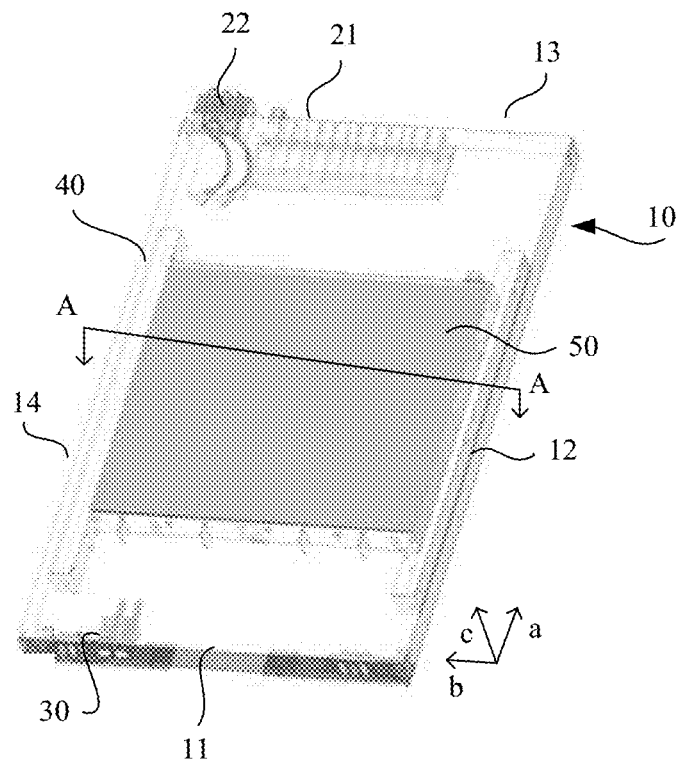
FIG. 3 is a three-dimensional diagram of the switch subrack shown in FIG. 2.

FIG. 3 is a three-dimensional diagram of the switch subrack shown in FIG. 2. For some reference numerals in FIG. 3, refer to the same reference numerals in FIG. 2. For ease of understanding, a direction b and a direction c are defined. The direction b and the direction c are separately perpendicular to the direction a, and the direction c is a height direction of the switch subrack. The outer frame 10 is specifically of a cuboid structure, and the outer frame 10 is a rectangular metal housing. The outer frame 10 is configured to fasten the switch and the transfer module and adapt to a switch slot in the cabinet system for normal plugging-in and plugging-out. Basic dimensions of the switch subrack are determined based on a blind-mate cabinet system. Take a 1U switch as an example. Dimensions of an outer frame 10 of the switch may be as follows: D (depth)*W (width)*H (height) is 839 cm*530 cm*43.5 cm. The outer frame 10 of the switch is configured to adapt to a cabinet with a width of 600 cm and a depth of 1050 cm. The outer frame 10 includes a bottom plate and four side walls. The four side walls are separately connected to the bottom plate, and the four side walls are connected end-to-end to form a frame structure. The four side walls and the bottom plate enclose a cavity for accommodating the switch, and the cavity may further accommodate the transfer module and the I/O module 30. In a specific example, the bottom plate and the four side walls may be of an integrated structure, that is, an integrated structure formed in a stamping or casting manner. Certainly, the bottom plate and the four side walls may alternatively be of split structures. For example, the four side walls and the bottom plate are fixedly connected through threaded support pieces (bolts or screws). To facilitate description, the four side walls are respectively named a first side wall 11, a second side wall 13, a third side wall 12, and a fourth side wall 14. The first side wall 11 is disposed opposite to the second side wall 13, and the third side wall 12 is disposed opposite to the fourth side wall 14. The first side wall 11 is the first panel of the outer frame 10, the second side wall 13 is the second panel of the outer frame 10, and the third side wall 12 and the fourth side wall 14 are configured to cooperate with the slot when the outer frame 10 is plugged into the slot in the cabinet. Structures, such as a guide rail or a guide rail, that slidably cooperate with slots may be disposed on the third side wall 12 and the fourth side wall 14. The structure may be a structure in the conventional technology, and details are not described herein.

Figure 4:
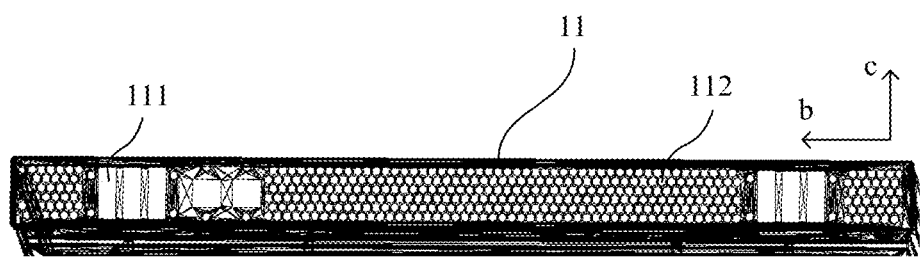
FIG. 4 is a schematic diagram of a first panel according to this application.

FIG. 4 is a schematic diagram of the first panel. The first panel is the first side wall 11, a jack 111 is disposed on the first side wall 11, and the jack 111 is configured to cooperate with the I/O module, the signal transfer module, or the power transfer module, so that a port that is used for an external connection of the I/O module, the signal transfer module, or the power transfer module is exposed outside the outer frame. A grid region 112 is further disposed on the first side wall 11, and the grid region 112 is configured to ventilate the switch. It should be understood that FIG. 4 merely shows an example in which the first side wall 11 includes the jack 111, and does not limit a shape and a disposition location of the jack 111, and a quantity of jacks 111.

Figure 5:
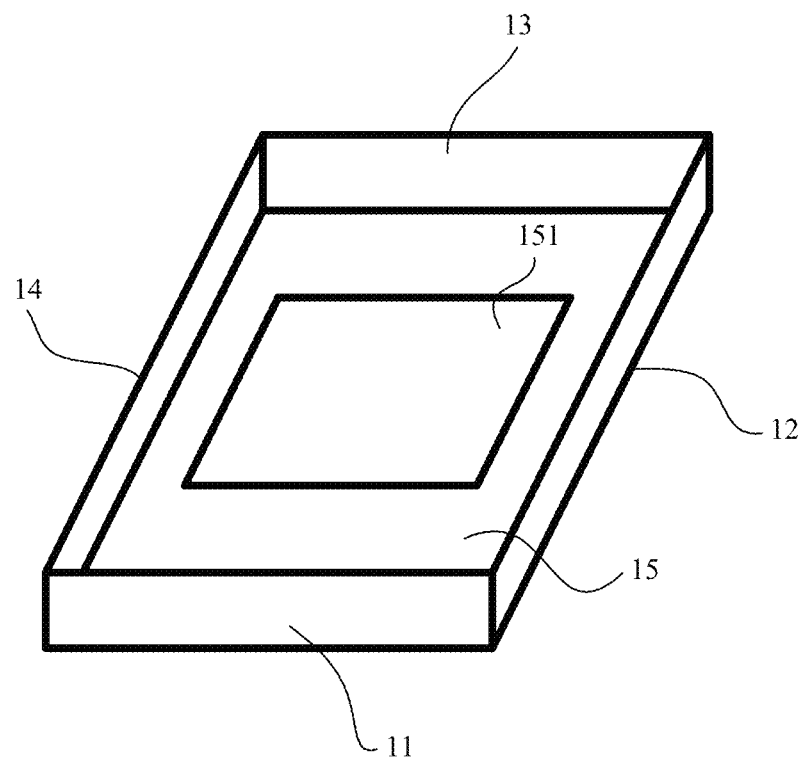
FIG. 5 is a schematic diagram of a structure of an outer frame according to this application.
Figure 6:
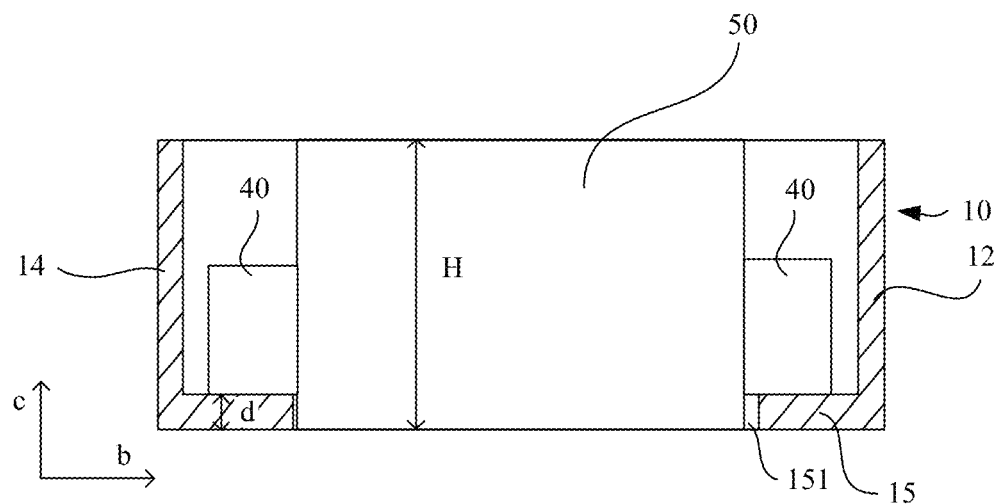
FIG. 6 is a sectional view at A-A in FIG. 3.

FIG. 5 is a schematic diagram of a structure of an outer frame according to an embodiment of this application. For some reference numerals in FIG. 5, refer to the same reference numerals in FIG. 3. In an optional implementation solution, a part of the metal housing in which the switch 50 is placed in the outer frame 10 needs to be hollowed, to form a hollowed-out structure 151 that accommodates the switch 50. For example, the hollowed-out structure 151 is formed, in a cutting manner, on the bottom plate 15 in a region used to cooperate with the switch 50, and a shape of the hollowed-out structure 151 is a rectangle. FIG. 6 is a sectional view at A-A in FIG. 3, that is, a sectional view obtained after downward cutting (in a direction opposite to the direction c) along an A-A cutting line. When the switch 50 is placed in the cavity, the switch 50 may be partially located in the hollowed-out structure 151. Generally, the switch 50 is 1U as standard or multi-U in height. If the outer frame 10 is not hollowed, a height of the switch 50 and the outer frame 10 exceeds 1U after the switch 50 is installed. To facilitate understanding, a thickness of the two components obtained when the hollowed-out structure 151 is disposed on the bottom plate 15 is compared with a thickness of the two components obtained when the hollowed-out structure 151 is not disposed on the bottom plate 15. For example, a thickness of the switch 50 is 1U. When the hollowed-out structure 151 is disposed on the bottom plate 15, H1 may be approximately equal to 1U. When there is no hollowed-out structure 151 on the bottom plate 15, H2=1U+d, where d is a thickness of the bottom plate 15 of the switch 50. Therefore, disposing the hollowed-out structure 151 on the bottom plate 15 can effectively reduce a thickness of the entire assembly, avoid a case in which the switch 50 cannot be plugged into the cabinet due to an excessively large thickness, and improve applicability of the switch subrack.

Figure 7:
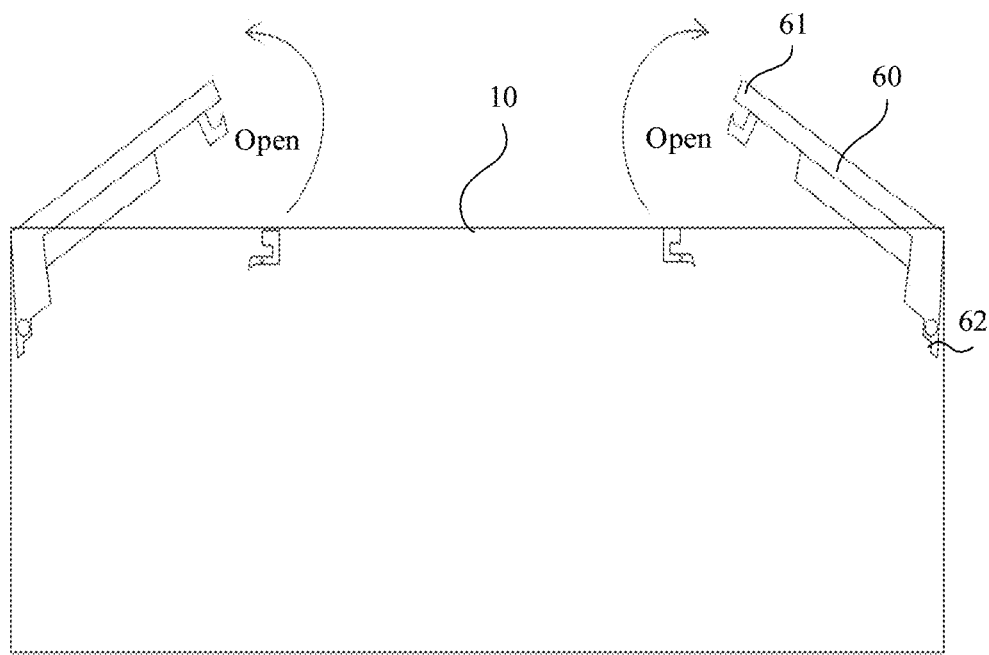
FIG. 7 is a schematic block diagram of cooperation between a force-borrowing wrench and an outer frame according to this application.

As shown in FIG. 7, as an optional solution, a force-borrowing wrench 60 rotatably connected to the outer frame 10 is further included. Refer to the first side wall in FIG. 2. The force-borrowing wrench 60 is disposed on the first side wall 11 of the outer frame 10. The force-borrowing wrench 60 is a lever structure. A first end 61 of the force-borrowing wrench 60 is used by a user to apply force, a second end 62 of the force-borrowing wrench 60 is configured to press against the cabinet, and a position at which the force-borrowing wrench 60 and the outer frame 10 are rotatably connected is close to the second end 62. When the switch is used, with a switch specification is improved, a quantity of connectors in the cabinet that are connected to the switch is increased, and force required for plugging-in and plugging-out of the switch is increased. To facilitate plugging-in and plugging-out of the switch, assistance of the force-borrowing wrench 60 is needed. By pulling the first end 61, the second end 62 can be pressed against the cabinet to pull the outer frame 10 out of the slot.

Figure 8:
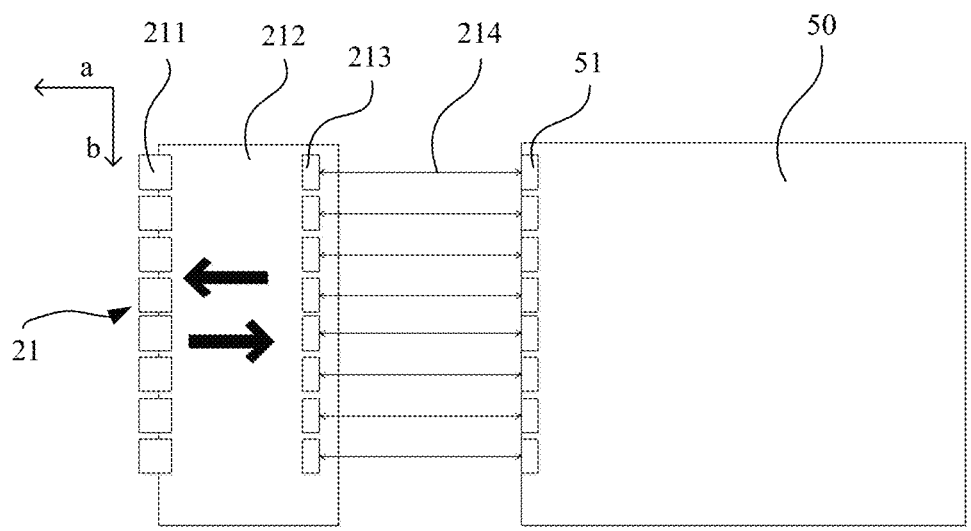
FIG. 8 is a diagram of an example topology between a signal transfer module and a switch according to this application.
Figure 9:
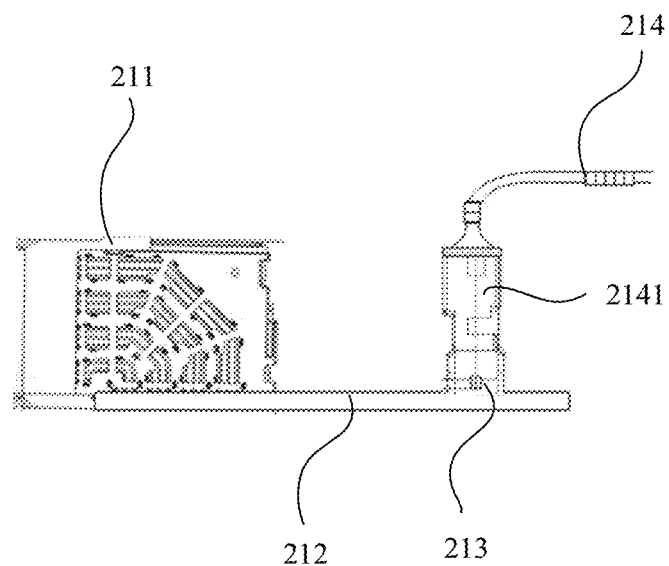
FIG. 9 is a side view of a signal transfer module according to this application.
Figure 10:
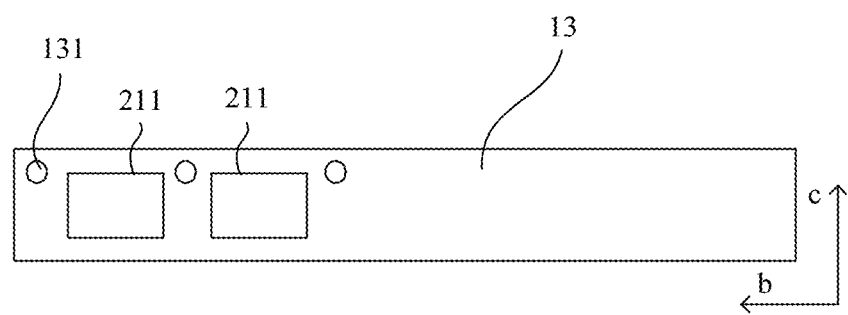
FIG. 10 is a block diagram of cooperation between a signal transfer module and an outer frame according to this application.

The following describes a specific structure of a signal transfer module provided in this application with reference to FIG. 8 to FIG. 10.

FIG. 8 is a diagram of an example topology between a signal transfer module and a switch. The signal transfer module 21 includes a blind-mate connector 211, a circuit board 212, a cable connector 213, and a first connection cable 214. The blind-mate connector 211 is a connector. The blind-mate connector 211 is fastened on the circuit board 212, and a connection end of the blind-mate connector 211 is exposed outside a side wall (the second panel) of the outer frame, and is configured to connect to a connector on a backplane in the cabinet. Refer to the cabinet in FIG. 1. The outer frame is plugged into the slot in the cabinet along the direction a, and the blind-mate connector 211 is connected to the backplane in the cabinet. The connector is configured to implement connection and signal transmission between the switch and the backplane of the cabinet, and the connector can support a component with a blind mating function. For example, the connector may support transmission of a high-speed signal such as a 100G/40G/25G/10G signal. In addition, a signal type supported by the connector of the switch subrack needs to be the same as a signal type supported by the connector on the backplane of the cabinet. In this way, the switch subrack can communicate with the backplane of the cabinet after the two connectors are connected.

The cable connector 213 is fastened on the circuit board 212, and is connected to the blind-mate connector 211 through a circuit on the circuit board 212. In FIG. 7, the blind-mate connector 211 and the cable connector 213 are respectively fastened to two opposite ends of the circuit board 212. Blind-mate connectors 211 and cable connectors 213 are in a one-to-one correspondence in quantity, and are arranged along a direction b. In this embodiment of this application, quantities of the blind-mate connectors 211 and the cable connectors 213 are not specifically limited. In a specific example, the quantities of the blind-mate connectors 211 and the cable connectors 213 shown in FIG. 8 are both eight. However, the quantities of the blind-mate connectors 211 and the cable connectors 213 provided in this embodiment of this application may match a corresponding network interface 51 of the switch 50, and a specific quantity may be set as required. A second connection end of the first connection cable 214 is connected to the network interface 51 of the switch 50, and a first connection end of the first connection cable 214 is connected to the cable connector 213. It should be understood that FIG. 8 is merely a specific topology of the signal transfer module 21 and the switch 50. The switch 50 and the signal transfer module 21 may alternatively use another topology relationship, provided that a signal of the switch 50 can be transferred to the backplane of the cabinet. A specific topology relationship is not specifically limited in this application.

FIG. 9 is a side view of the signal transfer module 21. The circuit board 212 provided in this embodiment of this application may be a printed circuit board or another type of circuit board. The blind-mate connector 211 is welded to the circuit board 212 and is connected to the circuit on the circuit board 212. The cable connector 213 is welded to the circuit board 212 and is connected to the circuit on the circuit board 212. The blind-mate connector 211 is connected to the cable connector 213 through the circuit on the circuit board 212. The first connection cable 214 has a first connection end 2141 and a second connection end (not shown in the figure). The first connection end 2141 and the second connection end are connected to different connectors. The first connection end 2141 is configured to be pluggably connected to the cable connector 213, and the second connection end is configured to be pluggably connected to a port (a network interface) of the switch 50. When the switch supports different signal types (for example, 100G/40G/25G/10G), the first connection end may be a universal connector, and the universal connector may support transmission of various types of signals. That is, a same first connection end may support transmission of signals of different signal types, and when the switch supports different signal types, the first connection end does not need to be replaced. In an optional solution, different types of first connection ends may alternatively be adapted to different network interfaces of the switch. For example, when a port of the cable connector 213 is an interface that supports a 100GE signal, a 10GE signal, or a 40GE signal, a port that matches the port may be separately selected as the first connection end to implement signal transmission.

When the network interface of the switch is a network interface such as QSPF28/SFP28, a port that matches the network interface may be separately selected as the second connection end. Because the first connection cable 214 is pluggably connected to the switch and the cable connector 213, when different models of switches or cable connectors 213 are used, connection may be implemented by replacing first connection cables 214 that include different models of first connection ends and different models of second connection ends. This improves adaptability, and facilitates connection between different types of switches and the signal transfer module 21. During the replacement, the cable only needs to be plugged out, a universal switch is replaced, and then the cable is reconnected.

FIG. 10 is a block diagram of cooperation between the signal transfer module and the outer frame. The blind-mate connector 211 is disposed on the second panel (the second side wall 13) of the outer frame, a first jack cooperating with the blind-mate connector 211 is disposed on the second panel of the outer frame, and a connection port of the blind-mate connector 211 passes through the first jack and is exposed outside the outer frame, to facilitate connection to the cabinet. Because a shape of the first jack adapts to the blind-mate connector 211, the first jack is not marked in FIG. 10. For a specific shape of the first jack, refer to the shape of the blind-mate connector 211. To implement blind mating between the signal connector and the cabinet, a guide sleeve 131 is disposed on the second panel, and correspondingly, a guide pin cooperating with the guide sleeve 131 is disposed on the backplane of the cabinet. During usage, the guide sleeve 131 is aligned with the guide pin, and then the blind-mate connector 211 is connected to the connector on the backplane in the cabinet. FIG. 10 shows an example of three guide sleeves 131. The three guide sleeves 131 are arranged around a plurality of blind-mate connectors 211. However, a quantity of guide sleeves 131 is not specifically limited in this embodiment of this application. In addition, a specific disposition location of the guide sleeve 131 is not specifically limited in this embodiment of this application, and the guide sleeve 131 may be disposed at different locations on the second panel as required.

Figure 11:
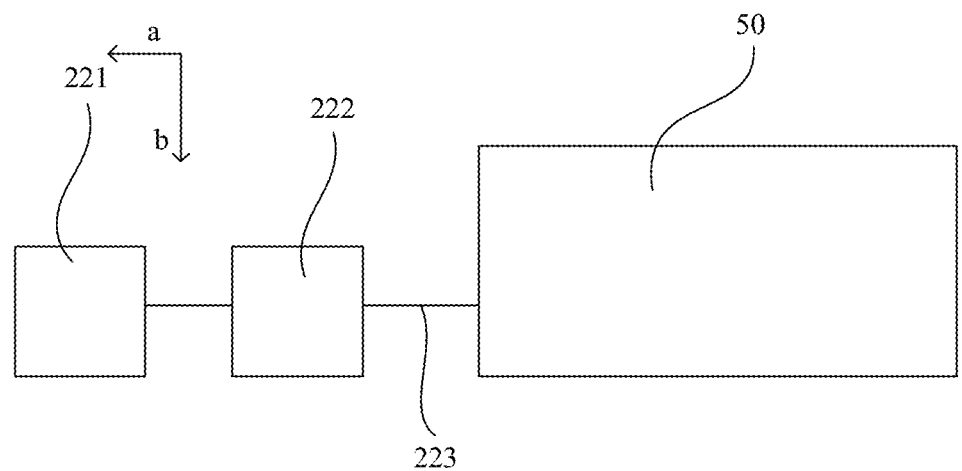
FIG. 11 is a diagram of a topology of a power transfer module according to this application.
Figure 12:
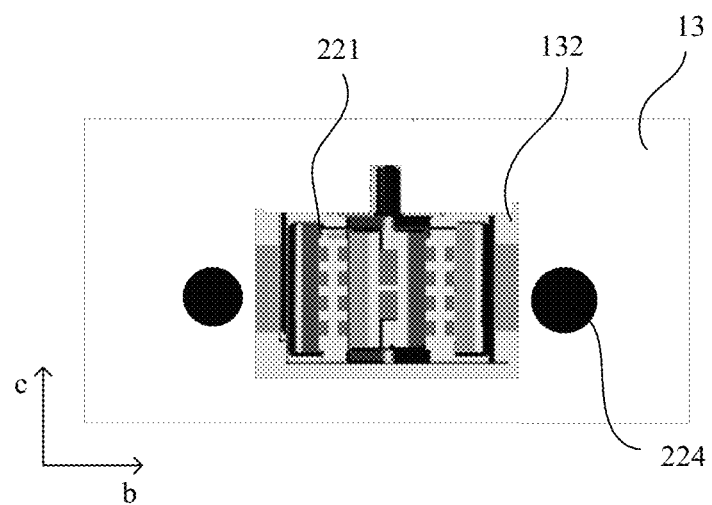
FIG. 12 is a block diagram of cooperation between a power transfer module and an outer frame according to this application.
Figure 13:
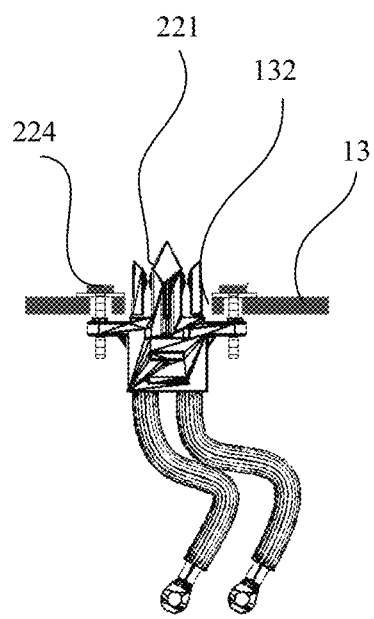
FIG. 13 is a schematic diagram of connection between a copper power-obtaining clip and a second panel according to this application.

The following describes a specific structure of a power transfer module provided in this application with reference to FIG. 11 to FIG. 13.

FIG. 11 is a diagram of a topology of a power transfer module according to an embodiment of this application. The power transfer module includes a copper power-obtaining clip 221, and a power adapter module 222 connected to the copper power-obtaining clip 221. The copper power-obtaining clip 221 is configured to connect to a copper bar in the cabinet. The power adapter module 222 is configured to convert power supply on the copper bar into a type of power supply that can be used by the switch 50. For example, the power adapter module 222 may be a module that changes a voltage and a current, or may be an alternating current (Alternating Current, AC)/direct current (Direct Current, DC) module, or a DC/AC module. The copper power-obtaining clip 221 is connected to the power adapter module 222 through a third connection cable (not marked in the figure), and the power adapter module 222 is connected to the switch 50 through a second connection cable 223. For example, the copper bar in the cabinet uses direct current power supply, and usually uses 48 V power supply. However, this is not specifically limited in this application, and a power supply manner is determined based on the copper bar in the cabinet. If a power module of the switch 50 does not adapt to the power supply (the copper bar) of the cabinet, the power adapter module 222 needs to be selected and configured, so that the power supply of the cabinet is converted into a type of power supply that can be used by the switch 50 by using the power adapter module 222. That is, the power adapter module 222 may be used as an optional part of the power transfer module. When the switch can adapt to the power supply of the cabinet (for example, a power supply requirement of the switch can be met without voltage and current conversion), the switch may be directly connected to the copper power-obtaining clip 221. When a current and/or voltage required by the switch cannot adapt to the power supply of the cabinet, the switch may be connected to the power adapter module 222, and then the power adapter module 222 is connected to the copper power-obtaining clip 221, so that the power adapter module 222 is configured to convert a current and/or voltage.

Optionally, the second connection cable 223 has a third connection end that is pluggably connected to the power adapter module 222 and a fourth connection end that is pluggably connected to the switch 50. The third connection end is a connector that adapts to the power adapter module 222, and the fourth connection end is a connector that adapts to the power supply of the switch 50. When the third connection end and the fourth connection end are used, the power adapter module 222 and the switch 50 can be pluggably connected. When the switch 50 and the power adapter module 222 use different connectors, connection between the switch 50 and the power adapter module 222 may be implemented by replacing the second connection cable 223.

FIG. 12 is a block diagram of cooperation between the power transfer module and the outer frame. A second jack 132 is disposed on the second panel (the second side wall 13) of the outer frame, and the copper power-obtaining clip 221 passes through the second jack 132 and is exposed outside the outer frame. A shape of the second jack 132 adapts to the copper power-obtaining clip 221, and the shape of the second jack 132 is larger than a size of the copper power-obtaining clip 221, so that the copper power-obtaining clip 221 can float in a direction b and a direction c, to implement a floating connection between the copper power-obtaining clip 221 and the outer frame.

FIG. 13 is a schematic diagram of connection between the copper power-obtaining clip and the second panel. The copper power-obtaining clip 221 is disposed on the second panel (the second side wall 13), the jack on the second side wall 13 is larger than a fastening screw 224, and the fastening screw 224 may move in each direction in a corresponding jack. When the copper power-obtaining clip 221 is connected to the copper bar in the cabinet, the copper power-obtaining clip 221 is connected to the copper bar in the cabinet through a guiding capability of the copper power-obtaining clip 221. In an optional implementation solution, a gasket (not marked in the figure) is sleeved on the fastening screw 224, and a size of the gasket is larger than a size of a connection hole, to prevent the fastening screw 224 from falling off from the connection hole.

Figure 14:
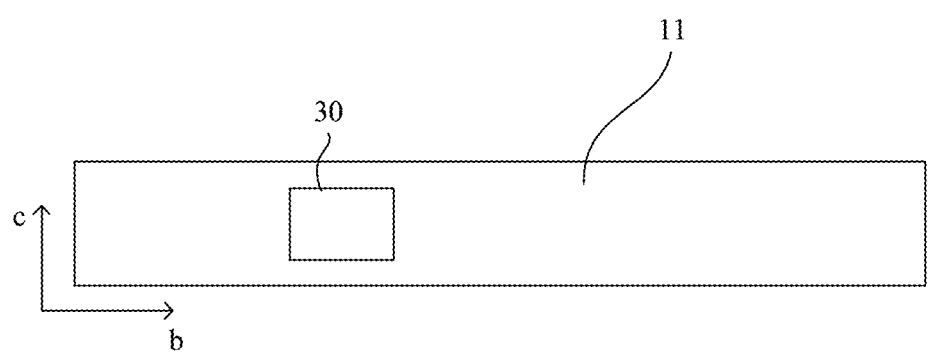
FIG. 14 is a schematic diagram of connection between an I/O module and a first panel according to this application.

The following describes a specific structure of an I/O module provided in this application with reference to FIG. 14. FIG. 14 is a schematic diagram of connection between the I/O module and the first panel. A third jack (the jack 111 in FIG. 4) is disposed on the first panel (the first side wall 11) of the outer frame, and the I/O module 30 passes through the third jack and is exposed outside the plastic frame. Because a shape of the third jack adapts to a shape of the I/O module 30, the third jack is not marked in FIG. 13. For the shape of the third jack, refer to an outline of the I/O module 30 shown in FIG. 14. The I/O module 30 is fixedly connected to the switch in a removable manner. For example, the I/O module 30 is connected to the switch through a fourth connection cable, and is configured to transfer the port or the indicator of the switch to the outer frame.

In an optional solution, the I/O module 30 includes maintenance interfaces such as a GE and a UART, a service interface that connects the switch to a core switch, and a status indicator of the switch. The maintenance interface is connected through a network cable, and the service interface is connected through an optical fiber patch cord.

Figure 15:
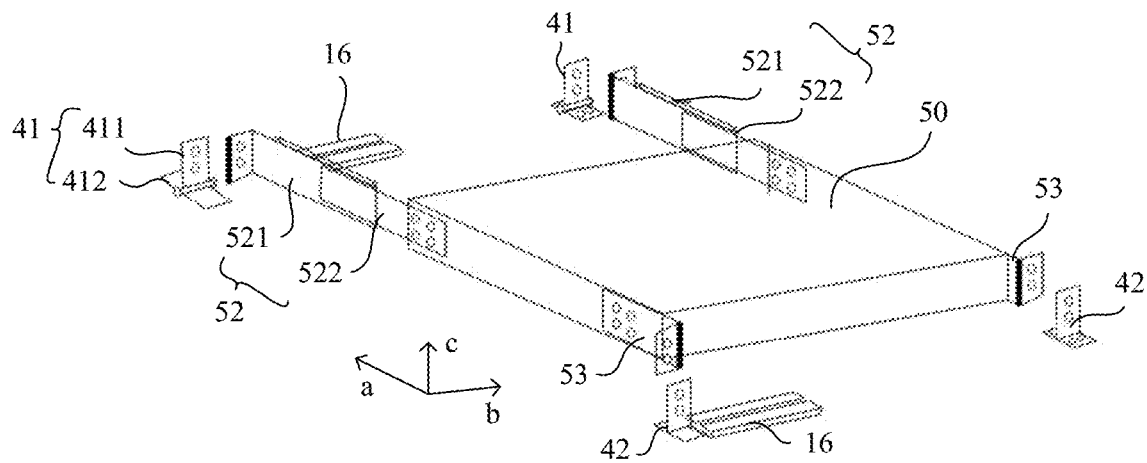
FIG. 15 is a schematic diagram of a specific structure of a fastening assembly according to this application.
Figure 16:
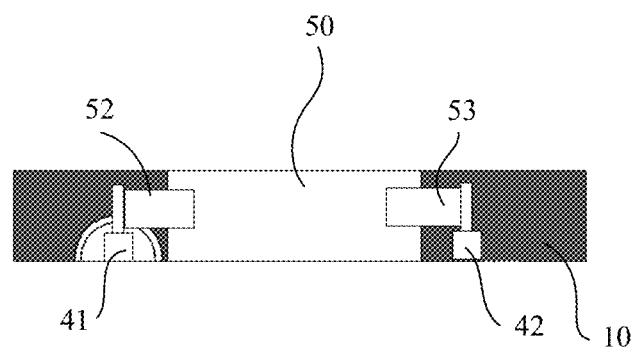
FIG. 16 is a simplified schematic diagram in which a switch is fastened in an outer frame according to this application.
Figure 17:
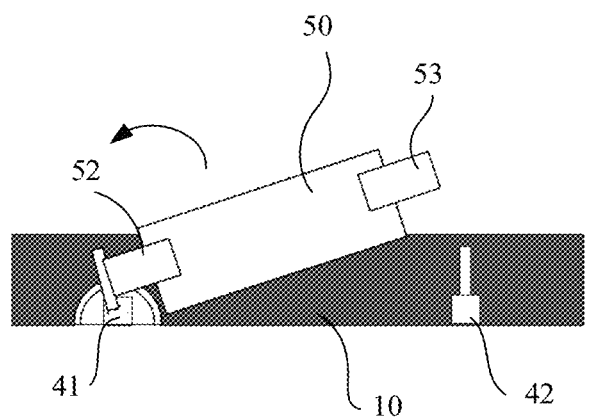
FIG. 17 is a simplified schematic diagram in which a switch is rotated relative to an outer frame according to this application.

The following describes a specific structure of a fastening assembly provided in this application with reference to FIG. 15 to FIG. 17.

FIG. 15 is a schematic diagram of a specific structure of a fastening assembly according to this application. The fastening assembly provided in this application is configured to fasten a switch 50 to an outer frame. The outer frame is omitted in FIG. 15, and only a structure in which the fastening assembly cooperates with the switch 50 is shown as an example. To facilitate understanding, a structure of the switch 50 is first described. A port configured to connect the switch 50 to an I/O module, and ports configured to connect the switch 50 to a power transfer module and a signal transfer module are respectively arranged at two ends of the switch 50 in a direction a. Two mounting bracket groups are disposed on the switch 50. The two mounting bracket groups are arranged in a direction b, and are disposed opposite to each other and respectively arranged on two sides of the switch 50. Each mounting bracket group includes a first mounting bracket 52 and a second mounting bracket 53, the first mounting bracket 52 and the second mounting bracket 53 are arranged in a first direction, and the first direction is the direction a. Four mounting brackets (two first mounting brackets 52 and two second mounting brackets 53) are respectively disposed at four end corners of the switch 50, and serve as fastening and supporting components of the switch 50 that are used to correspondingly connect to the fastening assembly in the outer frame, so that the switch 50 is fastened in the outer frame.

The first mounting bracket 52 is a mounting bracket that can extend or retract in the first direction. For example, the first mounting bracket 52 may include a first support plate 522 that is fastened on the switch 50 and a second support plate 521 that is slidably connected to the first support plate 522. Certainly, a structure of the first mounting bracket 52 may be implemented in another manner, provided that the first mounting bracket 52 can extend or retract in the first direction. The second mounting bracket 53 is a mounting bracket that has a fixed length. An end that is of each mounting bracket and that is away from the switch 50 has a bent structure (not marked in the figure) that is configured to connect to the fastening assembly. It should be understood that the foregoing mounting bracket is merely a specific example of a connector for connecting the switch 50 to another device. In addition to the foregoing mounting bracket, another known connection structure may be used to connect the switch 50 to another device.

The fastening assembly includes two connection assemblies, and the two connection assemblies are respectively in a one-to-one correspondence with the two mounting bracket groups. Each connection assembly includes a first support component 41 and a second support component 42. The first mounting bracket 52 is detachably fastened to the first support component 41, and the second mounting bracket 53 is detachably fastened to the second connection assembly, so that the switch 50 is fastened in the outer frame. When the mounting bracket is detachably connected to the support component, the mounting bracket may be fixedly connected to a corresponding support component by using a typical threaded connector such as a bolt or a screw.

In an optional solution, the fastening assembly is a fastening assembly with an adjustable size, to adapt to switches 50 of different sizes. As shown in FIG. 15, the two connection assemblies are separately slidably connected to the outer frame, and may be locked at specified locations. In addition, the two connection assemblies may slide in a second direction (the direction b). In a specific implementation, two guide rails 16 disposed in parallel are disposed in the outer frame, the two guide rails 16 are arranged in the direction a, and a length direction of each guide rail 16 extends in the direction b. The first support component 41 and the second support component 42 in each connection assembly are slidably assembled in the two guide rails 16 in a one-to-one correspondence. Two first support components 41 and two second support components 42 may slide back and forth in the guide rails 16 along the direction b. Therefore, the size of the fastening assembly may be adjusted in the direction b, and the switches 50 of different sizes are accommodated in the fastening assembly.

In an optional solution, the fastening assembly may be used to assembly the switches 50 of different sizes in a manner in which one connection assembly of the fastening assembly is fixedly connected to the outer frame, and the other connection assembly of the fastening assembly is slidably connected to the outer frame. It can be learned from the foregoing description that, according to the fastening assembly provided in this embodiment of this application, the switches 50 of different sizes can be accommodated provided that at least one of the two connection assemblies is slidably connected to the outer frame and can be locked at a specified location. When the guide rail 16 is used, the first support component 41 and the second support component 42 in the at least one connection assembly are slidably assembled on two parallel guide rails 16 in a one-to-one correspondence, and may be locked at specified locations.

In an optional solution, the four support components (the two first support components 41 and the two second support components 42) of the fastening assembly may also be fixedly connected to the outer frame. The four support components are spaced to form a fixed size in the direction a and the direction b. The switch subrack can accommodate only switches 50 whose sizes vary in the direction a. When the sizes of the switches 50 vary, a length of the first mounting bracket 52 can be changed to accommodate the switches 50 of different sizes.

In an optional solution, during maintaining of a fan and power supply of the switch, the switch needs to be tilted at a specific angle. To facilitate maintenance of the switch, the two connecting components may be rotated relative to each other. Specifically, the two connecting components are hingedly connected to the outer frame. As shown in FIG. 15, each first support component of the two connection assemblies includes a bottom plate 412 and a support plate 411 that is rotatably connected to the bottom plate 412. The bottom plate 412 is slidably assembled in a corresponding guide rail, and the support plate 411 is detachably fastened to a corresponding first mounting bracket 52. An axis around which the bottom plate 412 and the support plate 411 rotate is parallel to the second direction. FIG. 16 is a simplified schematic diagram in which a switch is fastened in an outer frame, and FIG. 17 is a simplified schematic diagram in which a switch is rotated relative to an outer frame. When the switch 50 is fastened in the outer frame 10, the first mounting bracket 52 and the second mounting bracket 53 are fixedly connected to the first support component 41 and the second support component 42 respectively by using threaded connectors such as bolts or screws. When maintenance of the switch 50 needs to be performed, the threaded connector connected the second support component 42 to the second mounting bracket 53 is removed, and the switch 50 is rotated along a direction shown by using an arc arrow in FIG. 17. The support plate of the first support component 41 may be rotated relative to the bottom plate of the first support component 41, so that the switch 50 is rotated relative to the outer frame 10 at a specific angle. After maintenance, the switch 50 may be rotated along a direction opposite to the direction shown by using the arrow in FIG. 17, and then the second mounting bracket 53 is fixedly connected to the second support component 42 again.

In an alternative solution, the foregoing structure of the first support component 41 may be used for the second support components 42 in the two connection assemblies, so that the switch can also be rotated to facilitate maintenance of the switch.

Figure 18:
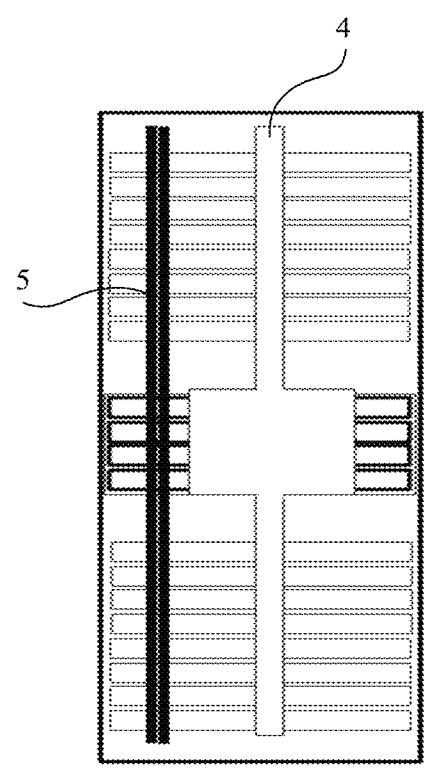
FIG. 18 is a schematic diagram of a back facet of a cabinet system according to this application.
Figure 19:
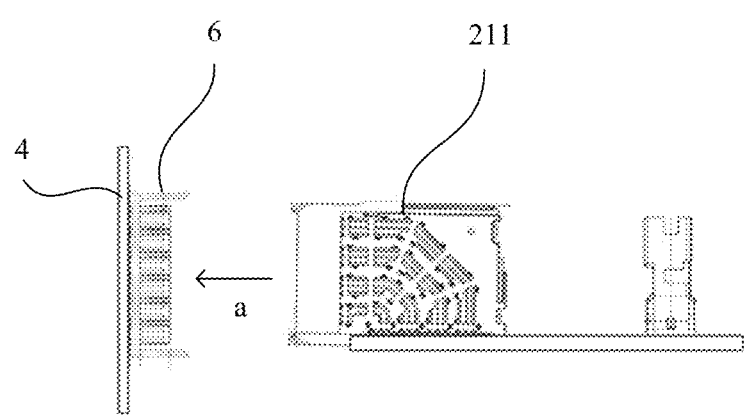
FIG. 19 is a schematic diagram of cooperation between a switch subrack and a blind-mate backplane according to this application.

FIG. 1 is a schematic diagram of a structure (front facet) of a cabinet system, and FIG. 18 is a schematic diagram of a back facet of the cabinet system. An embodiment of this application further provides a cabinet system. The system mainly includes a cabinet 1 (including a power supply), a compute node 2, a switch subrack 3, and a blind-mate backplane 4. In this application, a switch is fastened in the switch subrack 3, and the switch subrack 3 is configured to implement connection between compute nodes 2 in the cabinet 1 and connection between a server and an external network of the cabinet 1. For example, the switch is a 1U switch and is located in the middle of the cabinet 1. A quantity of switches is determined based on a network switching scale of the cabinet 1, and may be two or four. The switch and the compute node 2 obtain power from a copper bar 5 in the cabinet 1. The switch obtains power from the copper bar 5 through a power transfer module of the switch subrack 3. The switch is connected to the blind-mate backplane 4 of the cabinet 1 through a signal transfer module of the switch subrack 3. For example, as shown in FIG. 19, a blind-mate connector 211 on the switch subrack is a female connector, and a blind-mate connector 6 on the blind-mate backplane 4 is a male connector. The switch and the blind-mate backplane 4 are guided to complete connection between the female blind-mate connector and the male blind-mate connector. It can be learned from the foregoing description that, in the switch subrack 3 provided in this embodiment of this application, a connection port of the switch may be converted into a blind-mate interface by using the disposed transfer module, to implement blind mating of the switch without changing a structure of the switch.

In this embodiment of this application, a location of the blind-mate connector 6 on the backplane in the cabinet 1 corresponds to a location of a slot bearing the switch subrack 3. When the switch subrack 3 is plugged into the slot, the blind-mate connector 211 of the switch subrack 3 is connected in a manner in which a guide sleeve on an outer frame is aligned with a guide pin on the backplane, so that the blind-mate connector 211 of the switch outer frame 3 is aligned with and connected to the blind-mate connector 6 on the blind-mate backplane 4. It should be understood that the foregoing description is merely a specific example. In the cabinet system provided in this embodiment of this application, if the cabinet is a switch cabinet, and the backplane of the cabinet supports a blind mating function at any location, the switch frame may be plugged into the cabinet at any location through blind mating. If the backplane of the cabinet supports blind mating only in a limited range, blind mating of the switch frame can be implemented only at a location in the range.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A network switch subrack in a cabinet system, comprising:
a network switch;
an outer frame comprising a cavity for accommodating the network switch within the network switch subrack;
a fastening assembly disposed in the outer frame and configured to fasten the network switch; and
a transfer module disposed in the outer frame, wherein a first end of the transfer module is pluggably connected to the cabinet system, and a second end of the transfer module is pluggably connected to the network switch.

2. The network switch subrack according to claim 1, wherein the transfer module comprises a signal transfer module and a power transfer module that are fixedly connected to the outer frame.

3. The network switch subrack according to claim 2, wherein the signal transfer module comprises a blind-mate connector, a connection end of the blind-mate connector being exposed outside a side wall of the outer frame and configured to be pluggably connected to the cabinet system.

4. The network switch subrack according to claim 3, wherein the signal transfer module further comprises a circuit board connected to the blind-mate connector, a cable connector disposed on the circuit board, and a first connection cable having a first connection end pluggably connected to the cable connector and a second connection end pluggably connected to the network switch.

5. The network switch subrack according to claim 2, wherein the power transfer module comprises:
a copper power-obtaining clip;
a power adapter module connected to the copper power-obtaining clip; and a second connection cable having a first connection end pluggably connected to the power adapter module and a second connection end pluggably connected to the network switch.

6. The network switch subrack according to claim 5, wherein the copper power-obtaining clip is disposed on a side wall of the outer frame in a floating manner.

7. The network switch subrack according to claim 1, further comprising an input/output (I/O) module detachably fastened to the outer frame, wherein the I/O module is fixedly connected to the network switch in a removable manner.

8. The network switch subrack according to claim 1, wherein the fastening assembly is a fastening structure adjustable based on a size of the network switch.

9. The network switch subrack according to claim 8, wherein the fastening assembly comprises two connection assemblies configured to fasten the network switch, each connection assembly comprising a first support component and a second support component,
wherein the network switch comprises two mounting bracket groups disposed opposite to each other, the two mounting bracket groups are in a one-to-one correspondence with the two connection assemblies, and each mounting bracket group comprises a first mounting bracket extendable and retractable in a first direction and a second mounting bracket having a fixed length, and
wherein the first mounting bracket is detachably fastened to the first support component, and the second mounting bracket is detachably fastened to the second support component.

10. The network switch subrack according to claim 9, wherein at least one connection assembly of the two connection assemblies is slidably connected to the outer frame and lockable in a specified location, and slidable in a second direction perpendicular to the first direction.

11. The network switch subrack according to claim 10, wherein the two connection assemblies are separately slidably connected to the outer frame.

12. The network switch subrack according to claim 10, wherein two guide rails are disposed in parallel in the outer frame, and a first support component and a second support component in the at least one connection assembly are slidably assembled on the two guide rails in a one-to-one correspondence and lockable at specified locations.

13. The network switch subrack according to claim 12, wherein the first support component comprises a bottom plate and a support plate rotatably connected to the bottom plate and configured to be detachably fastened to a corresponding first mounting bracket, wherein an axis around which the bottom plate and the support plate rotate is parallel to the second direction.

14. The network switch subrack according to claim 1, further comprising a pluggable force-borrowing wrench rotatably connected to the outer frame.

15. A cabinet system, comprising:
a cabinet; and
a network switch subrack comprising:
    a network switch;
    an outer frame, comprising a cavity for accommodating the network switch within the network switch subrack;
    a fastening assembly, disposed in the outer frame and configured to fasten the network switch; and
    a transfer module, disposed in the outer frame, wherein a first end of the transfer module is pluggably connected to the cabinet system, and a second end of the transfer module is pluggably connected to the network switch.

16. The cabinet system according to claim 15, wherein the transfer module of the network switch subrack comprises a signal transfer module and a power transfer module that are fixedly connected to the outer frame.

17. The cabinet system according to claim 16, wherein the signal transfer module comprises a blind-mate connector, a connection end of the blind-mate connector being exposed outside a side wall of the outer frame and configured to be pluggably connected to the cabinet system.

18. The cabinet system according to claim 17, wherein the signal transfer module further comprises a circuit board connected to the blind-mate connector, a cable connector disposed on the circuit board, and a first connection cable having a first connection end pluggably connected to the cable connector and a second connection end pluggably connected to the network switch.

19. The cabinet system according to claim 16, wherein the power transfer module comprises:
a copper power-obtaining clip;
a power adapter module connected to the copper power-obtaining clip; and
a second connection cable having a first connection end pluggably connected to the power adapter module and a second connection end pluggably connected to the network switch.

20. The cabinet system according to claim 19, wherein the copper power-obtaining clip is disposed on a side wall of the outer frame in a floating manner.

\* \* \* \* \*